United States Patent
Chen et al.

(10) Patent No.: US 11,212,938 B2
(45) Date of Patent: Dec. 28, 2021

(54) SERIAL TRANSMISSION FAN CONTROL DEVICE, SERIAL FAN CONTROL SYSTEM AND METHOD THEREOF

(71) Applicant: GIGA-BYTE TECHNOLOGY CO., LTD., New Taipei (TW)

(72) Inventors: Yuan Chieh Chen, New Taipei (TW); Chin Hui Chen, New Taipei (TW); Shih Hsiao Hsu, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 360 days.

(21) Appl. No.: 16/398,004

(22) Filed: Apr. 29, 2019

(65) Prior Publication Data

US 2020/0187383 A1    Jun. 11, 2020

(30) Foreign Application Priority Data

Dec. 11, 2018    (TW) .................................. 107144456

(51) Int. Cl.
*H05K 7/20* (2006.01)
*H04L 12/40* (2006.01)

(52) U.S. Cl.
CPC ... *H05K 7/20209* (2013.01); *H04L 12/40013* (2013.01); *H04L 12/40019* (2013.01); *H05K 7/20136* (2013.01)

(58) Field of Classification Search
None
See application file for complete search history.

(56) References Cited

U.S. PATENT DOCUMENTS 6,163,539 A * 12/2000 Alexander .............. H04L 12/56
370/389
8,069,328 B2    11/2011 Pyeon
(Continued)

FOREIGN PATENT DOCUMENTS

CN    101119036 A    2/2008
CN    102662383 A    9/2012
(Continued)

OTHER PUBLICATIONS

The Chinese office Action for CN 201811509736.6 (Year: 2021).*
(Continued)

*Primary Examiner* — Fahmida Rahman
(74) *Attorney, Agent, or Firm* — Maschoff Brennan

(57) ABSTRACT

A serial transmission fan control device comprises a master controller, a first fan controller, and a second controller. The master controller generates a serial control data, wherein the serial control data comprises a plurality of packets concatenated in an order and each of the plurality of packets comprises a control parameter set of a fan. The first fan controller electrically connects to the master controller, receives the serial control data, extracts a packet from the plurality of packets of the serial control data, and sends a first downlink serial data, wherein the first downlink data comprises all of the plurality of packets of the serial control data except for the extracted packet. The second fan controller electrically connects to the first fan controller, receives the first downlink serial data, and extracts a packet from the packets of the first downlink serial data.

16 Claims, 8 Drawing Sheets

(56) References Cited

U.S. PATENT DOCUMENTS

| | | |
|---|---|---|
| 2005/0077846 A1 | 4/2005 | Makaran |
| 2009/0027009 A1 | 1/2009 | Sivertsen |
| 2012/0244015 A1 | 9/2012 | Benson |
| 2013/0148293 A1* | 6/2013 | Shih .......................... G06F 1/20 361/679.48 |
| 2014/0013726 A1 | 1/2014 | Yacoub |
| 2015/0195882 A1 | 7/2015 | Chu |
| 2017/0177533 A1 | 6/2017 | Jiang et al. |

FOREIGN PATENT DOCUMENTS

| | | | |
|---|---|---|---|
| CN | 104768277 A | | 7/2015 |
| CN | 204989814 U | * | 1/2016 |
| CN | 204989814 U | | 1/2016 |
| CN | 106292315 A | * | 1/2017 |
| CN | 106292315 A | | 1/2017 |
| TW | 201724821 A | | 7/2017 |

OTHER PUBLICATIONS

TW Office Action in application No. 107144456 dated Oct. 3, 2019.
European Search Report dated Nov. 11, 2019 in application No. 19171245.4.
CN Office Action dated Apr. 23, 2021 as received in Application No. 201811509736.6.

* cited by examiner

SERIAL TRANSMISSION FAN CONTROL DEVICE, SERIAL FAN CONTROL SYSTEM AND METHOD THEREOF

CROSS-REFERENCE TO RELATED APPLICATIONS

This non-provisional application claims priority under 35 U.S.C. § 119(a) on Patent Application No(s). 107144456 filed in Taiwan, ROC on Dec. 11, 2018, the entire contents of which are hereby incorporated by reference.

BACKGROUND

1. Technical Field

This disclosure relates to fan control, and more particularly to a serial transmission fan control device, a serial fan control system, and a serial fan control method.

2. Related Art

The heat dissipation of the server is very important. The main heat dissipation method currently adopted in the chassis is to cool the overheated working components and the environment by the fan, thereby maintaining the stability of the server system.

A set of fans corresponds to a set of control signals in a conventional design. However, the ICs (Integrated Circuit) currently used for fan controlling only supports 3-5 sets of control signals at most. Supposed that the server needs 8 fan sets, there should be 2 ICs to support all of the 8 fan sets, thus the hardware cost increases. Furthermore, each set of control signals at least comprises two signal wires. As a result, 16 signal wires are necessary for 8 fan sets. More signal wires mean that a larger area has to be preserved on a circuit board and problems such as ground bounce and noise occur easier.

SUMMARY

In view of the above, the present disclosure proposes a serial transmission fan control device, a serial fan control system, and a serial fan control method to solve the problems mentioned previously.

According to an embodiment of the present disclosure, a serial transmission fan control device comprises a master controller configured to generate a serial control data, wherein the serial control data comprises a plurality of packets concatenated in an order and each of the plurality of packets comprises a control parameter set of a fan; a first fan controller electrically connecting to the master controller, wherein the first fan controller is configured to receive the serial control data, extract a packet from the plurality of packets of the serial control data and send a first downlink serial data, wherein the first downlink serial data comprises all of the plurality of packets of the serial control data except for the extracted packet; and a second fan controller electrically connecting the first fan controller, wherein the second fan controller is configured to receive the first downlink serial data and extract a packet from the packets of the first downlink serial data.

According to an embodiment of the present disclosure, a serial fan control system comprises a master controller configured to generate a serial control data, wherein the serial control data comprises a plurality of packets concatenated in an order; a first fan device comprising a first fan controller and a first fan, wherein the first fan controller electrically connects to the first fan and the master controller, receives the serial control data, extracts a packet from the plurality of packets of the serial control data, sends a first downlink serial data, and generates and sends a first driving instruction to the first fan according to the packet extracted from the plurality of packets of the serial control data, wherein the first downlink serial data comprises all of the plurality of packets of the serial control data except for the extracted packet; and a second fan device comprising a second fan controller and a second fan, wherein the second fan controller electrically connects to the second fan and the first fan controller, receives the first downlink serial data, extracts a packet from the packets of the first downlink serial data, and generates and sends a second driving instruction to the second fan according to the packet extracted from the packets of the first downlink serial data.

According to an embodiment of the present disclosure, a serial fan control method comprises: generating a serial control data by a master controller, wherein the serial control data comprises a plurality of packets concatenated in an order, and each of the plurality of the packets comprises a control parameter set of a fan; receiving the serial control data and extracting a packet from the plurality of packets of the serial control data by a first fan controller; after extracting the packet from the plurality of packets of the serial control data, generating and sending a first driving instruction to a first fan according to the control parameter set of the extracted packet by the first fan controller; after extracting the packet from the plurality of packets of the serial control data, sending a first downlink serial data by the first fan controller, wherein the first downlink serial data comprises all of the plurality of packets of the serial control data except for the extracted packet; receiving the first downlink serial data by a second fan controller and extracting a packet from the packets of the first downlink serial data; and after extracting the packet from the packets of the first downlink serial data, generating and sending a second driving instruction to a second fan by the second fan controller according to the control parameter set of the extracted packet from the first downlink serial data.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
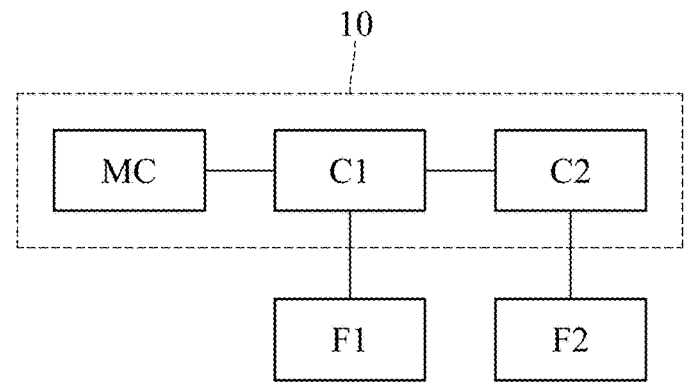
FIG. 1A is an architecture diagram of the fan control system adopting the serial transmission fan control device according to an embodiment of the present disclosure.

Please refer to FIG. 1A, which illustrates an architecture diagram of a fan control system adopting a serial transmission fan control device according to an embodiment of the present disclosure. As shown in FIG. 1A, the serial transmission fan control device 10 comprises a master controller MC, a first fan controller C1 and a second fan controller C2. The first fan controller C1 electrically connects to the master controller MC and electrically connects to the first fan F1, the second fan controller C2 electrically connect firsts to the first fan controller C1 and electrically connects to the second fan F2. As shown in FIG. 1A, the master controller MC, the first fan controller C1 and the second fan controller C2 form a serial structure.

Figure 1B:
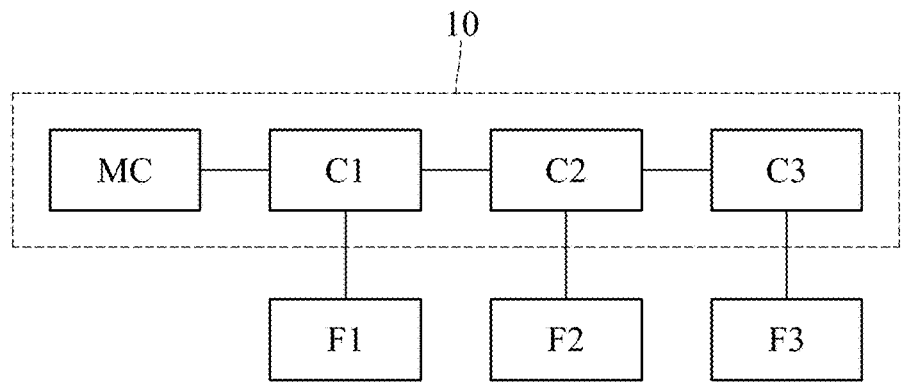
FIG. 1B is an architecture diagram of the fan control system with a newly added fan controller and newly added fan based on FIG. 1A.

Practically, when a server system needs additional fans, a new fan controller can be concatenated in the serial structure of the serial transmission fan control device 10, and a new fan can be electrically connected to the new fan controller as shown in FIG. 1B, which illustrates an architecture diagram of the fan control system with the newly added third fan controller C3 and the newly added third fan F3 based on FIG. 1A. The third fan controller C3 electrically connects to the second fan controller C2 and electrically connects to the third fan F3 for controlling the third fan F3. Basically, a newly added fan controller can be selectively inserted in the middle of the serial structure or be concatenated on the end of the serial structure, and the present disclosure does not limit thereof.

In an embodiment of the present disclosure, there is an ADC (Analog-to-Digital Converter) or a DAC (Digital-to-Analog Converter, DAC) inside the controller like the master controller MC, the first fan controller C1, and the second fan controller C2.

The master controller MC receives control instructions from a high-level software to generate a serial control data. The serial control data comprises a plurality of packets concatenated in order. Each of the plurality of packets comprises a control parameter set configured to control a specific fan. In other words, the packet generated by the master controller MC and the fans respectively correspond to each other. The high-level software has the information of the number of the fans beforehand, and the uses the master controller MC to generate packets as the serial control data, with the number of packets corresponding thereto.

Practically, said serial control data comprises a plurality of bytes. These bytes can be divided into a starting byte, data bytes, and a stopping byte. The contents of aforementioned control parameter set are presented in a manner of the data bytes, and comprises, for example, a fan address, a fan speed, and a fan activation state, and are not limited thereby. The starting byte and the stopping byte are configured to represent the beginning and the end of the packet. The starting byte or the stopping byte is one of the high level of voltage, low level of voltage and tristate logic, or a combination of the above. Practically, codes with specified high/low-level logic can serve as the starting byte and as the stopping byte, and the present disclosure does not limit thereto.

The first fan controller C1 receives the serial control data from the master controller MC, extracts a packet from the serial control data and sends a first downlink serial data including the rest of the packets of the serial control data. In other words, the first downlink serial data comprises all of the plurality of packets of the serial control data except for the extracted packet. The present disclosure does not limit the manner of extracting a packet by the fan controller. Said manner is, for example, extracting the first-received packet of the serial control data, extracting a packet after obtaining the starting byte with a specific code, or extracting a packet after a specific number of clocks passed when the serial control data is received per byte by the fan controller. In the following description, the embodiment adopts a policy of "extracting the first-receiving packet" whose advantage is that two tasks, "obtaining the control parameter set from the packet and then driving the fan" and "sending the downlink serial data to the fan controller of the next level of the serial structure", can be proceeded at the same time after the fan controller extracts the packet, so that the overall fan control time can be saved thereby.

Please refer to FIG. 1A. The second fan controller C2 receives the first downlink serial data sent from the first fan controller C1, extracts a packet from the first downlink serial data. Please refer to FIG. 1B, when the serial transmission fan control device 10 further comprises the third fan controller C3, the second fan controller C2 is further configured to send the second downlink serial data. The second downlink serial data comprises all of the packets of the first downlink serial data except for the extracted packet. The third fan controller C3 receives the second downlink serial data and extracts a packet from the second downlink serial data. Practically, hardware devices of the second fan controller C2, the third fan controller C3 and the first fan controller C1 are the same.

Please refer to FIG. 1A, after extracting a packet, the first fan controller C1 decodes therefrom to get the control parameter of the packet for generating the driving instruction, and then send, through the socket of the fan, the driving instruction to the fan driver to perform the fan control operation, so does the second fan controller C2. On the other hand, the first and the second fan controllers C1, C2 also respectively obtain the current states of the fans through a sensor embedded or disposed near the respective fan, and feedback said states to the master controller MC. Specifically, the second fan controller C2 generates, according to the state of the second fan F2, the second feedback packet whose content comprise such as the operating state of the fan or the temperature information of the space around the fan.

The present disclosure does not limit the content of the feedback packet. Similarly, the first fan controller C1 generates the first feedback packet according to the state of the first fan F1. In addition, the first fan controller C1 receives the second feedback packet from the second fan controller C2 and concatenates the first feedback packet and second feedback packet to form a serial feedback data. In general, the fan controller locating at the rear of the serial structure (such as the second fan controller C2 of FIG. 1A or the third fan controller C3 of FIG. 1B) does not receive the feedback packet from any fan controllers, so the fan controller does not need to perform the packet concatenation. In contrast, the fan controller in the middle of the serial structure (such as the first fan controller C1 of FIG. 1A or the first and the second fan controller C1, C2 of FIG. 1B) has to concatenate the feedback packet generated by itself and the serial feedback data received by itself. The master controller MC locating at the front of the serial structure receives the serial feedback data composed of feedback packets of all fan controllers through the first fan controller C1, and then feedback the information of all feedback packets to the high-level software to analysis or process depending on the requirement.

One of the characteristics of the present disclosure of the serial transmission fan control device 10 is that the master controller connects to all of the fan controllers in a manner of the serial structure. The serial transmission fan control device 10 can be integrated with a plurality of fans to form a fan system. Practically, every fan controller except for the master controller MC can be embedded into the fan to form a concatenable fan device.

Figure 2:
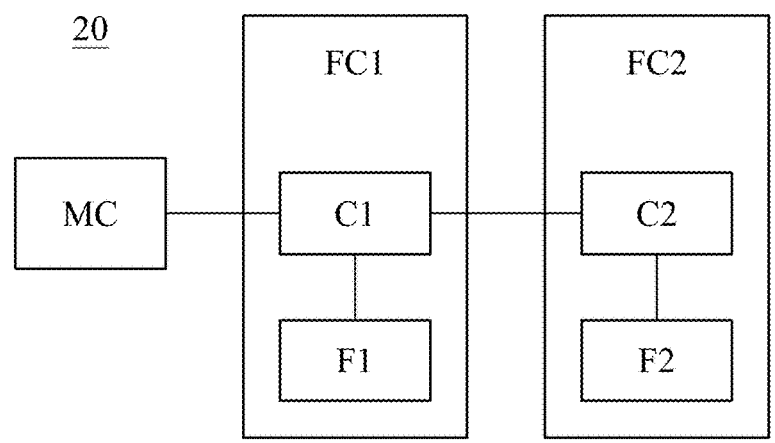
FIG. 2 is an architecture diagram of the serial fan control system according to an embodiment of the present disclosure.

Please refer to FIG. 2, which illustrates the serial fan control system 20 of an embodiment of the present disclosure. The serial fan control system 20 comprises the master controller MC, the first fan device FC1, and the second fan device FC2. The master controller MC electrically connects to the first fan device FC1, the first fan device FC1 electrically connects to the second fan device FC2. The first fan device FC1 comprises the first fan controller C1 and the first fan F1 electrically connected to each other. The second fan device FC2 comprises the second fan controller C2 and the second fan F2 electrically connected to each other. The first fan device FC1 uses the first fan controller C1 to electrically connect to the second fan device FC2. The implementation details of the master controller MC and fan controllers have been described in previous paragraphs and will not be described here again. Practically, when the user needs more fans, a new fan device can be directly concatenated to the serial structure of the serial fan control system 20, for example, the third fan device (not depicted) electrically connects to the second fan device FC2. Specifically, the third fan controller C3 electrically connects to the second fan controller C2.

Figure 3:
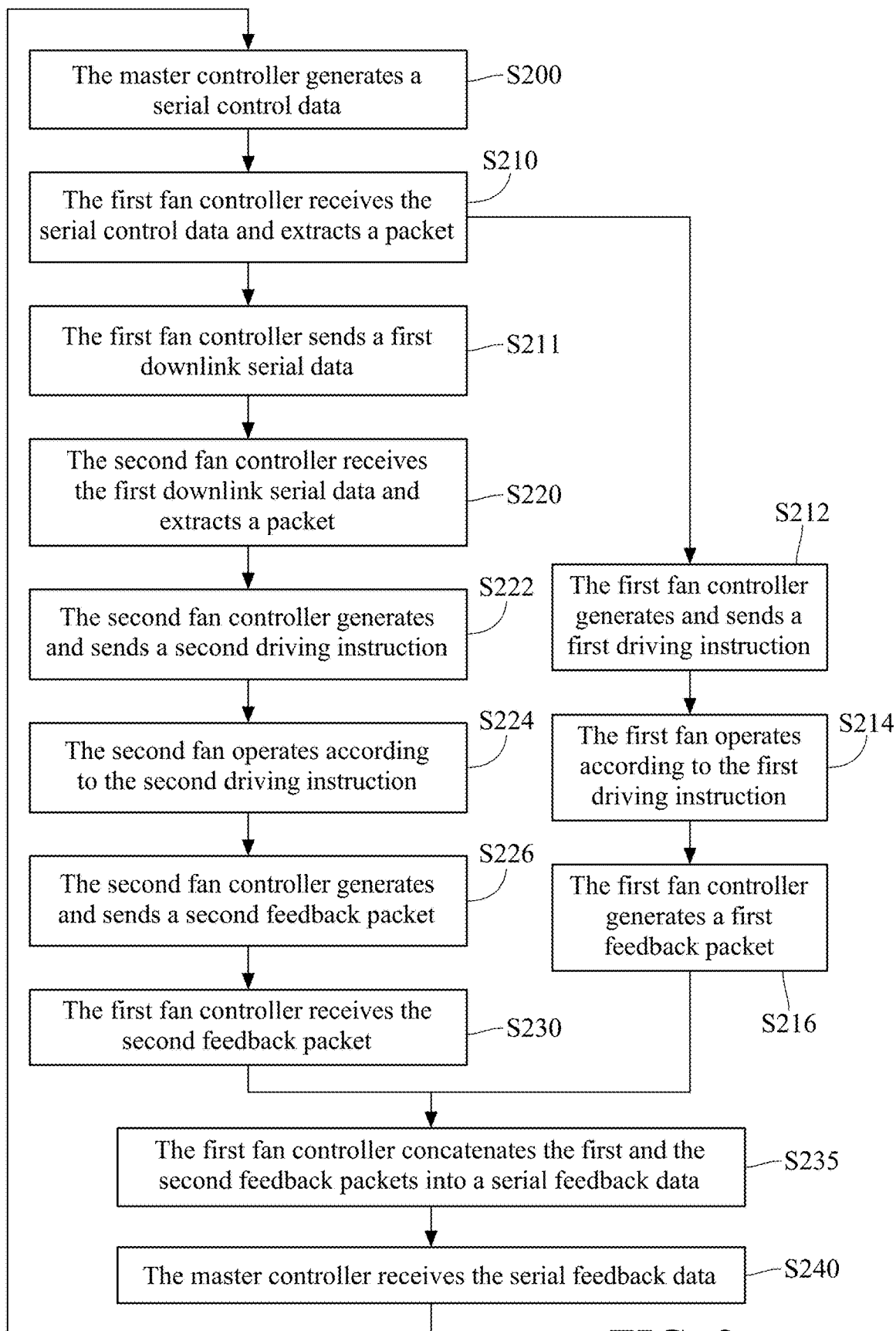
FIG. 3 is a flowchart of the serial fan control method according to an embodiment of the present disclosure.

Please refer to FIG. 1A and FIG. 3 together. FIG. 3 illustrates a flowchart of the serial fan control method according to an embodiment of the present disclosure. Please refer to step S200 and step S210 together, the master controller MC generates and sends the serial control data to the first fan controller C1. After receiving the serial control data, the first fan controller C1 extracts a packet therefrom. Please refer to step S211, S212, and S214 together. After extracting the packet from the serial control data, the first fan controller C1 sends the first downlink serial data. In addition, after extracting the packet from the serial control data, the first fan controller C1 generates and sends the first driving instruction to the first fan F1 according to the control parameter set, and the first fan F1 operates according to the first driving instruction.

Please refer to step S220, the second fan controller C2 receives the first downlink serial data and extracts a packet therefrom. Please refer to step S222 and step S224, the second fan controller C2 generates and sends the second driving instruction to the second fan F2 according to the extracted packet, and the second fan F2 operates according to the second driving instruction. Please refer to step S216 and step S226 together, after obtaining the current state of the first fan F1, the first fan controller C1 generates a first feedback packet. Similarly, after obtaining the current state of the second fan F2, the second fan controller C2 generates the second feedback packet. Since the second fan controller C2 locates at the rear of the serial structure, the second feedback packet has to be feedback to the fan controller of the previous level, that is, the second fan controller C2 sends the second feedback packet to the first fan controller C1.

Please refer to step S230, when receiving the second feedback packet from the second fan controller C2, the first fan controller C1 concatenates the first and the second feedback packet to form the serial feedback data, as shown in step S235. The master controller MC receives this serial feedback data through the first fan controller C1 as shown in step S240. The master controller MC adjusts control parameter sets of the serial control data sent next time according to the fan states of feedback packets of serial feedback data, and step S200 is performed again to proceed the fan control.

Figure 4A:
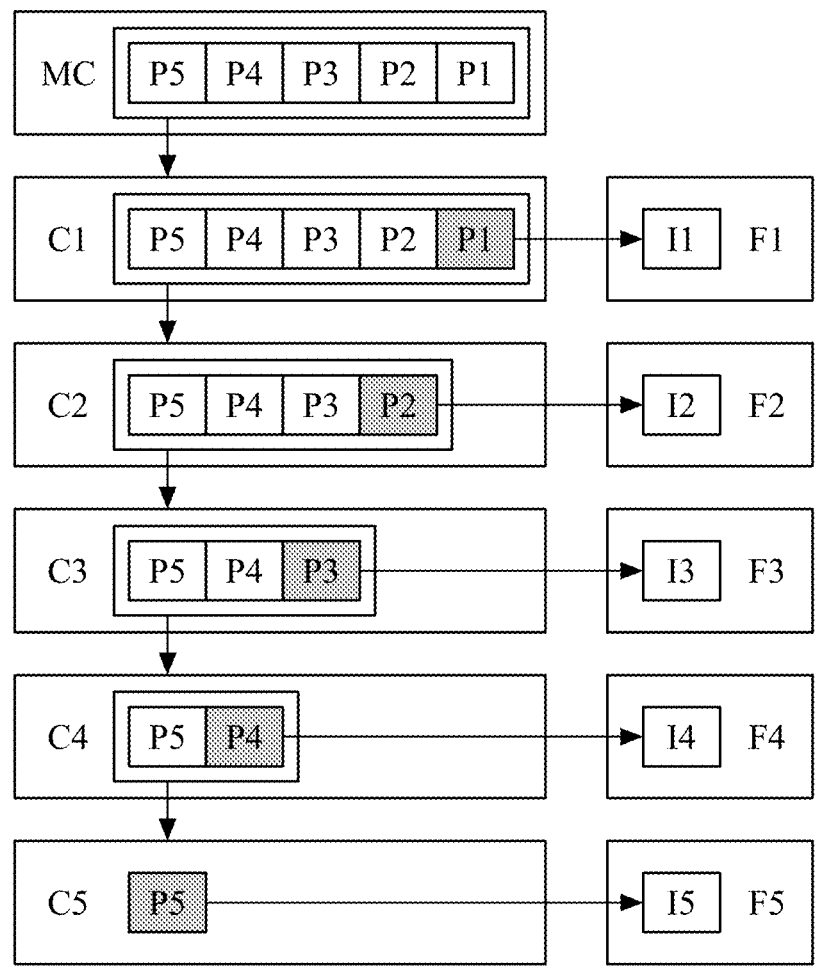
FIG. 4A is a schematic diagram of sending the serial control data according to an implementation of the present disclosure.

For clearly describing the serial fan control method of the above embodiment, please refer to FIG. 4A, which illustrates a schematic diagram of sending the serial control data according to an implementation of the present disclosure. The illustrative serial fan control system of FIG. 4A comprises five fan controller C1-C5 connecting to fan F1-F5 respectively. The master controller MC generates and sends the serial control data which comprises five packet P1-P5 in a concatenated form. Please refer to the arrows shown in FIG. 4A. After receiving the serial control data sent from the master controller MC, the first fan controller C1 extracts the packet P1 and then converts the contents thereof to the driving instruction I1 for controlling the first fan F1. Furthermore, the rest of the packets P2-P5 are served as the first downlink serial data sending to the second fan controller C2. After receiving the first downlink serial data, the second fan controller C2 extracts the packet P2 and then convert the contents thereof to the driving instruction I2 for controlling the second fan F2. Furthermore, the rest of the packets P3-P5 are served as the second downlink serial data sending to the third fan controller C3, and so on. The last fan controller C5 of the serial structure receives a downlink serial data with only packet P5 for controlling the fifth fan F5. In brief, each time a fan controller in the serial structure receives a downlink serial data, the content of the downlink serial data is reduced by one packet and then the reduced downlink serial data is sent to the next fan controller in the serial structure until all of the fan controllers therein have received their packets.

Figure 4B:
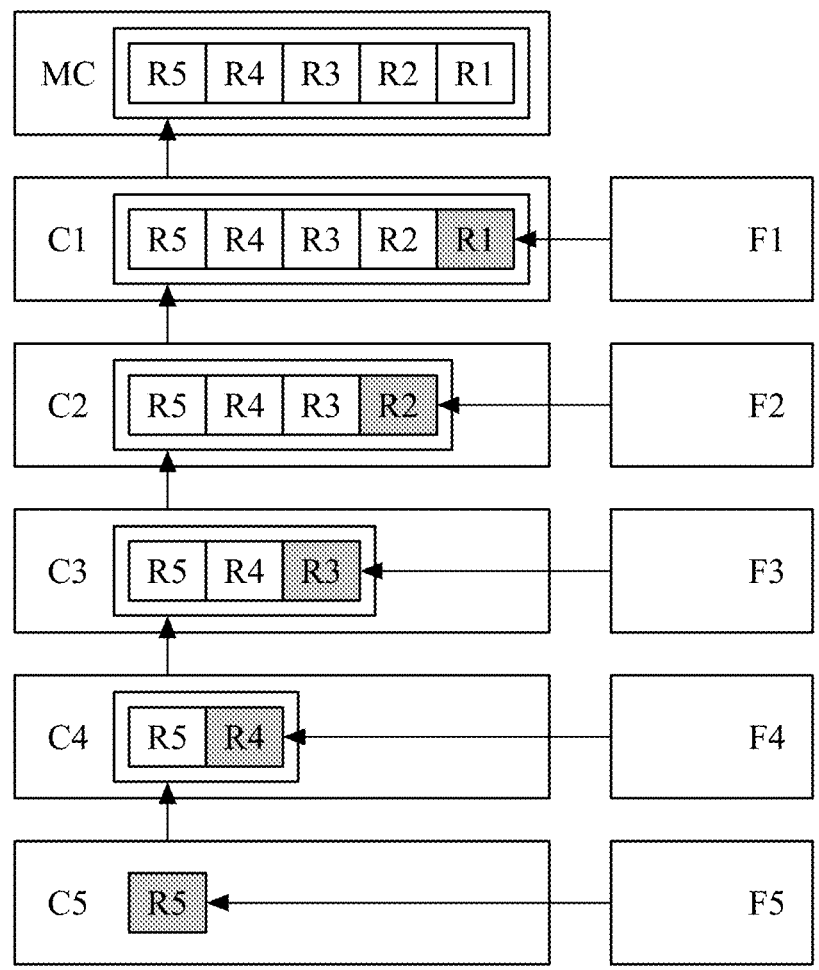
FIG. 4B is a schematic diagram of receiving the serial feedback data according to an implementation of the present disclosure.

Please refer to FIG. 4B, which illustrates a schematic diagram of receiving the serial feedback data according to an implementation of the present disclosure. The procedure shown in FIG. 4B and the procedure shown in FIG. 4A can be performed at the same time or the procedure shown in FIG. 4B is performed after that shown in FIG. 4A is finished, the present disclosure does not limit the order. The fifth fan controller C5 generates the feedback packet R5 and sends the feedback packet R5 to the fourth fan controller C4 according to the current state of the fifth fan F5. Similarly, the fourth fan controller C4 generates the feedback packet R4 according to the current state of the fourth fan F4. After receiving the feedback packet R5 from fifth fan controller C5, the fourth fan controller C4 concatenates the feedback packet R4 and the feedback packet R5 to form the serial feedback data, and then sends the serial feedback data to the third fan controller C3. The present disclosure does no limit the concatenation order of the previous two feedback packet R5 and R4. By the same token, in the end, the serial feedback data received by the master controller MC should comprise feedback packets of all of the fans F1-F5. In sum, each time a fan controller in the serial structure sends a feedback packet, the content of the serial feedback data is increased by one feedback packet until the master controller MC receives the feedback packets of all fans.

Practically, the transmissions of the serial control data and serial feedback data according to an embodiment of the present disclosure can adopt a mechanism of full duplex. Namely, both of control-packet-sending and feedback-packet-returning have the characteristic of bidirectional transmission. Therefore, the transmissions of the serial control data and the serial feedback data as shown in FIG. 4A and FIG. 4B can be performed simultaneously. However, the procedures shown in FIG. 4A and the procedure shown in FIG. 4B can also be performed separately in time, and the present disclosure does not limit thereto.

Figure 5:
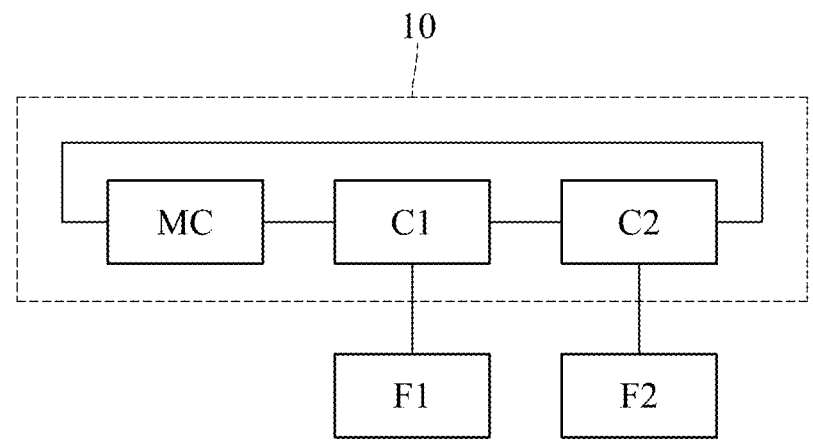
FIG. 5 is an architecture diagram of the fan control system adopting the serial transmission fan control device according to another embodiment of the present disclosure.
Figure 6:
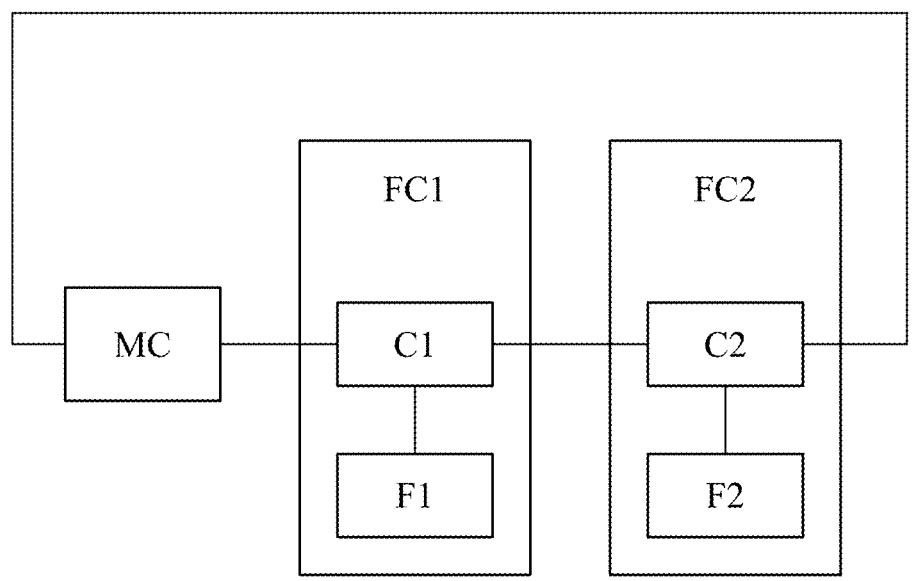
FIG. 6 is an architecture diagram of the serial fan control system according to another embodiment of the present disclosure.

Please refer to FIG. 5 and FIG. 6. FIG. 5 illustrates an architecture diagram of the fan control system adopting the serial transmission fan control device 10 according to another embodiment of the present disclosure, wherein the second fan controller C2 further electrically connects to the master controller MC. FIG. 6 illustrates an architecture diagram of the serial fan control system 20 according to another embodiment of the present disclosure, wherein the second fan device FC2 (especially the second fan controller C2 therein) further electrically connects to the master controller MC.

The main difference between this embodiment and the previous embodiment is the transmission manner of the feedback packet. Specifically, after receiving the serial control data, the first fan controller C1 generates the first feedback packet and concatenates this first feedback packet with the first downlink serial data, and then sends this concatenated first downlink serial data to the next fan controller of the serial structure. Similarly, after receiving the concatenated first downlink serial data, the second fan controller C2 generates the second feedback packet and concatenates this second feedback packet with the first feedback packet of the first downlink serial data to form the second downlink serial data and sends this second downlink serial data to the fan controller of the next level of the serial structure (which is the master controller MC in FIG. 5). By the electrical connection between the master controller MC and the fan controller of the last level of the serial structure (which is the second fan controller C2 in FIG. 5), the master controller MC can receive the serial feedback data directly.

Figure 7:
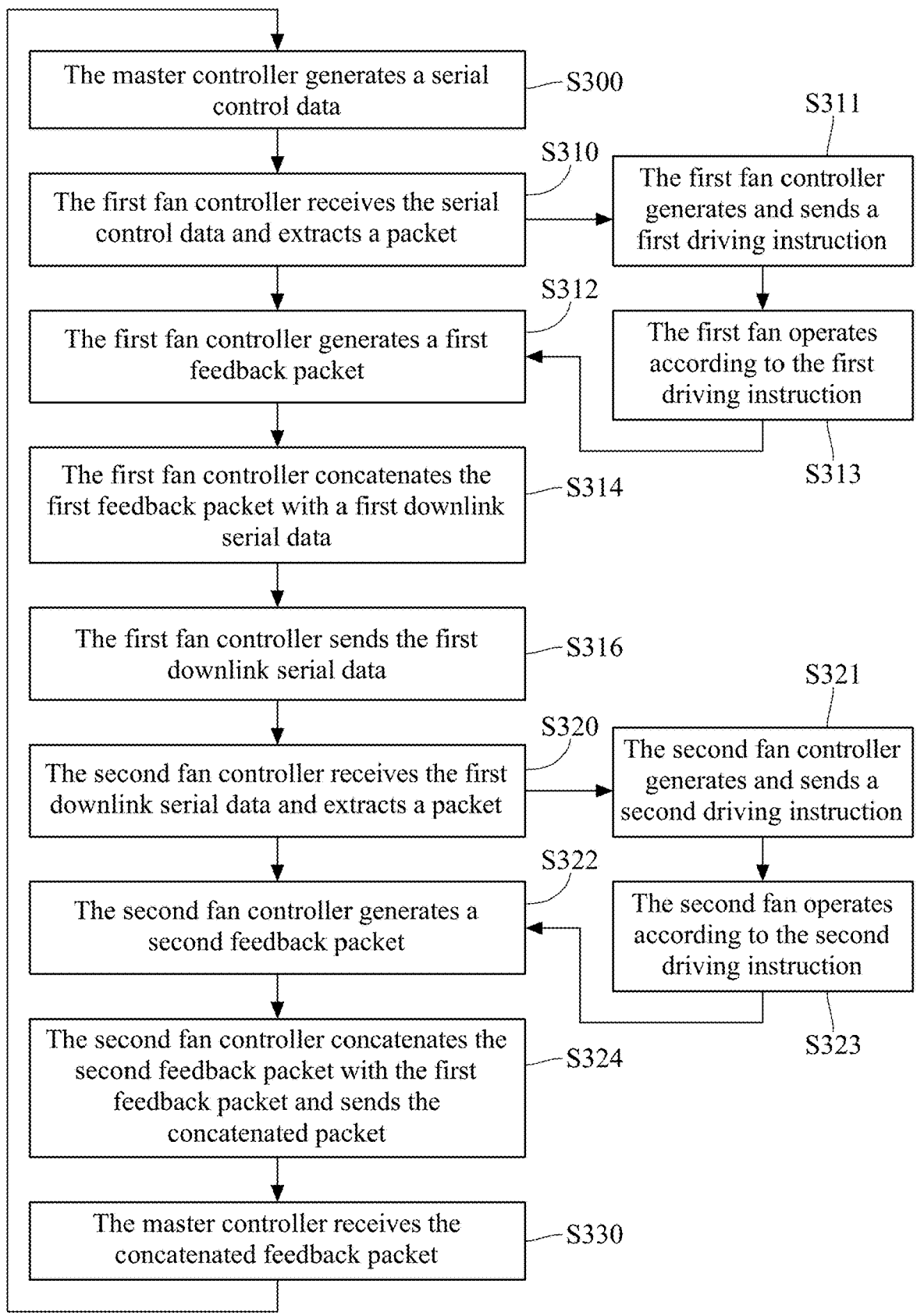
FIG. 7 is a flowchart of the serial fan control method according to another embodiment of the present disclosure.

Please refer to FIG. 7, FIG. 7 illustrates a flowchart of the serial fan control method according to another embodiment of the present disclosure. Before step S300, master controller MC generates the serial control data, the master controller MC, the first fan controller C1 and the second fan controller C2 are electrically connected to each other in a ring, or the master controller MC, the first fan device FC1 and the second fan device FC2 are electrically connected to each other, as the connection illustrated in FIG. 5 or FIG. 6.

Please refer to step S300 and step S310, the master controller MC generates the serial control data and sends this serial control data to the first fan controller C1. After receiving the serial control data, the first fan controller C1 extracts a packet therefrom. The above flow is basically the same as step S200-S210 in FIG. 3. After extracting the packet, the first fan controller C1 generates and sends the driving instruction to the first fan F1 according to the control parameter set in the packet. After receiving the driving instruction, the first fan F1 operates according to its instructing content. The above flows are illustrated as step S311 and step S313. Please refer to step S312. On the other hand, after extracting the packet, the first fan controller C1 generates the feedback packet. Practically, step S312 can be performed before or after step S313. In other words, the content of the generated feedback packet can be a previous fan state or a current fan state of the first fan F1. Specifically, the previous fan state is responsive to a previous packet, the current fan state is responsive to a current packet received right after the previous packet. The present disclosure does not limit thereto.

Please refer to step S314, the first fan controller C1 concatenates the first feedback packet with the first downlink serial data. The present disclosure does not limit the size of the control packet of the feedback packet and that of the serial control data. Practically, in order to facilitate the fan controller extracts the packet, the size of the feedback packet and the size of the control packet can be set to the same size. Please refer to step S316, the first fan controller C1 sends the first downlink serial data comprising the first feedback packet and other control packets that have not yet been extracted.

Please refer to step S320, the second fan controller C2 receives the first downlink serial data and extracts a packet therefrom. After extracting the packet, the second fan controller C2 generates and sends the driving instruction to the second fan F2 according to the control parameter set in the packet. After receiving the driving instruction, the second fan F2 operates according to its instructing content. The above flows are shown in step S321 and S323. Please refer to step S322. On the other hand, after extracting the packet, the second fan controller C2 generates the second feedback packet.

Please refer to step S324 and step S330 together, after step S322, generating the second feedback packet, the second fan controller C2 concatenates the second feedback packet with the first feedback packet and sends the concatenated packet to the master controller MC. The master controller MC can adjust the control parameter set of the serial control data that will be sent next time according to the reflected fan state of each feedback packet in the serial feedback data, and then the step S300 is performed again to continue controlling the fan.

Figure 8:
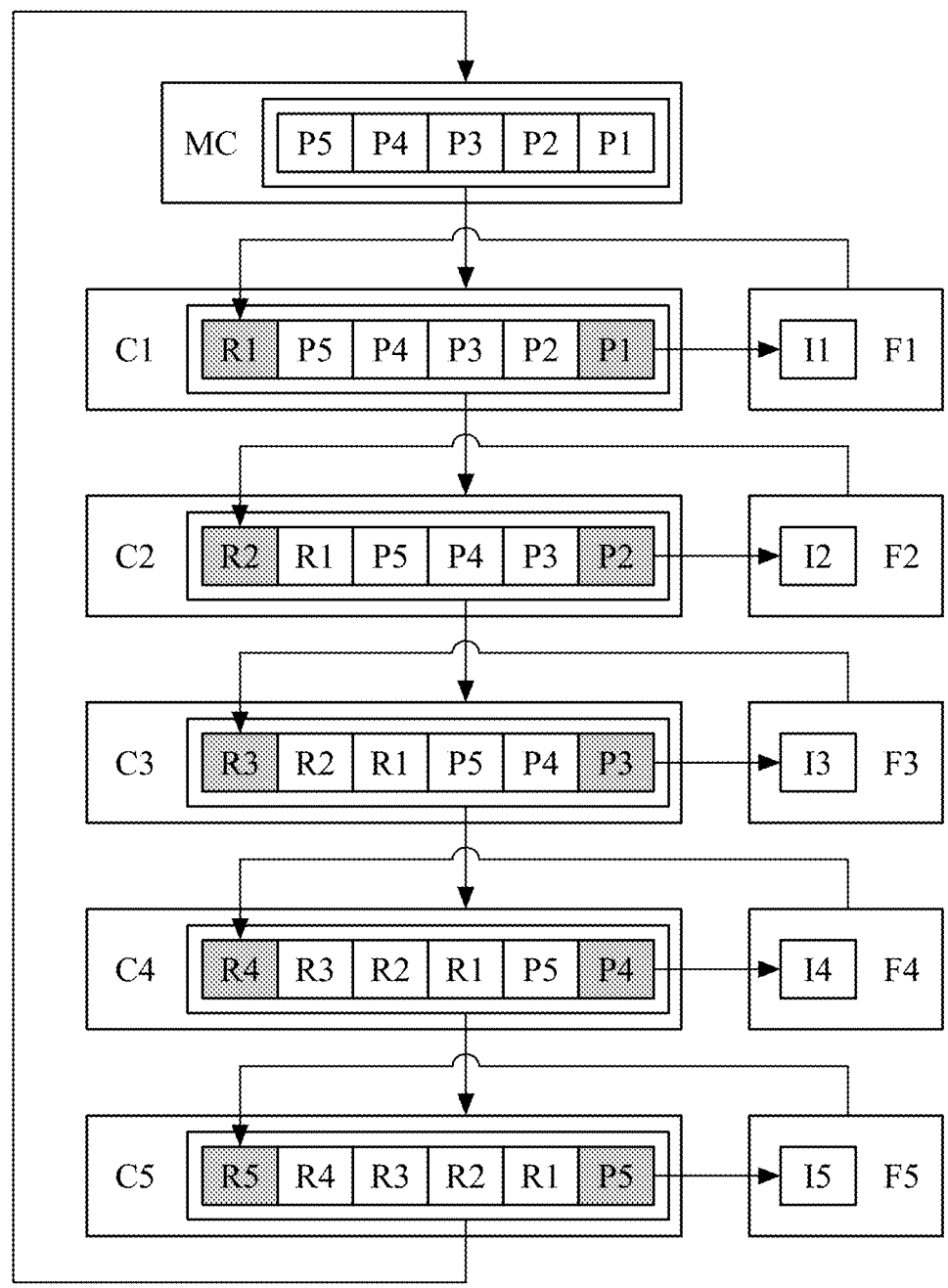
FIG. 8 is a schematic diagram of sending the serial control data and receiving the serial feedback data according to another implementation of the present disclosure.

In order to more clearly explain the serial fan control method of the above embodiment, please refer to FIG. 8, which illustrates is a schematic diagram of sending the serial control data and receiving the serial feedback data according to another implementation of the present disclosure. The fifth fan controller C5 locating at the rear of the serial structure further electrically connects to the master controller MC. The master controller MC generates and sends the serial control data comprising five concatenated packets P1-P5. Please refer to arrows shown in FIG. 8. After receiving the serial control data from the master controller MC, the first fan controller C1 extracts the packet P1 and convert the contents of the packet P1 into the driving instruction I1 for controlling the first fan F1. At the same time, the first fan controller C1 generates the feedback packet R1 according to the current state of the first fan F1 and concatenates this feedback packet R1 to the rear of the other packets P2-P5 as shown by the arrow (F14→R1) in FIG. 5. The first fan controller C1 sends the first downlink serial data to the second fan controller C2, wherein the first downlink serial data comprises the feedback packet R1 and the other packets P2-P5. Similarly, the second fan controller C2 extracts the packet P2 from the first downlink serial data and convert the contents of the packet P2 into the driving instruction 12 for controlling the second fan F2. At the same time, the second fan controller C2 generates the feedback packet R2 and concatenates the feedback packet R2 to the rear of the other packets P3-P5 and the feedback packet R1 to form the second downlink serial data, as shown by the arrow (F24→R2) in FIG. 5, and then the second fan controller C2 sends this second downlink serial data. The behaviors of the following third and the fourth fan controller C3, C4 are similar to the above description. It should be noticed that: after generating the feedback packet R5 and concatenates it after the feedback packet R4, the fifth fan controller C5 will use the connection between the fifth fan controller C5 and the master controller MC to send this serial feedback data (It is called the serial feedback data since there are no packets P1-P5 for controlling fans) to the master controller MC.

In said another implementation described above, the feedback packet of each fan controller are obtained as soon as the packet of the serial control data is extracted by each fan controller. Once the last packet of the serial control data is extracted by the fan controller extract, those feedback packets that obtained along the serial structure can be immediately fed back to the master controller MC. Therefore, getting the feedback information can be efficient and the time thereof can be saved, meanwhile, the advantage of reducing physical wires of the serial structure can be preserved.

Figure 9:
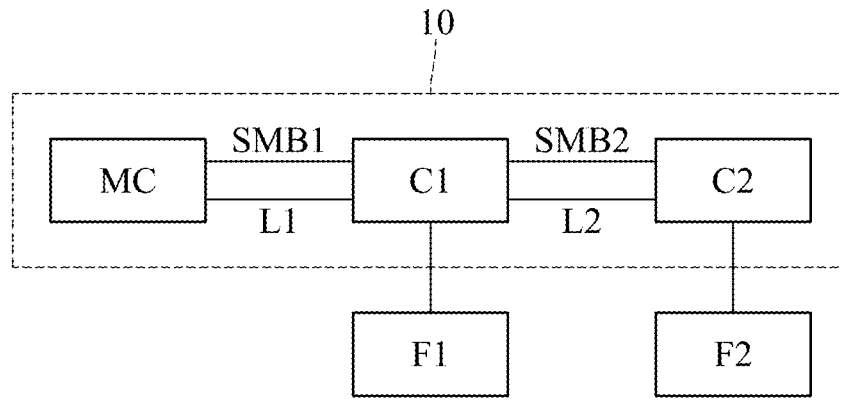
FIG. 9 is an architecture diagram of the serial fan control device according to further another embodiment of the present disclosure.

Please refer to FIG. 9, which illustrates an architecture diagram of the serial fan control device 10 according to further another embodiment of the present disclosure. This embodiment is based on the serial transmission fan control device 10 of the previous embodiment. In addition to the original serial structure L1, L2, the serial fan control device 10 of this embodiment further comprises a serial structure (SMB1, SMB2) adapted to selective transmission.

Practically, the newly added serial structure SMB1 and SMB2 are such as system management buses (SMBus). SMBus is a simple two-wire bus based on I2C (Inter-Integrated Circuit) and is for the purpose of lightweight communication, such as controlling the specified fan driving circuit. In the further another embodiment of present disclosure, controllers such as the master controller MC, the first fan controller C1, and the second fan controller C2 further comprise ports to connect to the SMBuses. For example, the master controller MC uses the SMBus SMB1 to electrically connect to the first fan controller C1, and the first fan controller F1 uses the SMBus SMB2 to electrically connect to the second fan controller C2.

When the serial structure comprises a plurality of fan controllers, using the SMBus to transmit a single serial data packet to a specified fan controller can reduce the delay time of the transmission. In short, the master controller MC can use the SMBus to designate one or some of the fan controllers and control a respective one or more fans thereof. Specifically, the master controller MC is further configured to generate a notification packet and a control packet according to the further another embodiment of the present disclosure as illustrated in FIG. 9. The notification packet comprises a target ID associated with a target controller. The target controller is at least one of the first fan controller C1 and the second fan controller C2. The control packet comprises another control parameter corresponding to the target fan of the target controller. The first fan controller C1 further comprises two ports for connecting to the master controller MC and the second fan controller C2 through two specified buses according to the further another embodiment of the present disclosure, and the first fan controller C1 further sends an acknowledge packet directly to the master controller MC when receiving the notification packet with the target ID associated with the first fan controller C1. After receiving the control packet, the first fan controller C1 further generates and sends another first driving instruction to the first fan F1 according to the control packet. Similarly, the second fan controller C2 further sends an acknowledgment packet directly to the master controller MC when receiving the notification packet with the target ID associated with the second fan controller C2. After receiving the control packet, the second fan controller C2 generates and sends another second driving instruction to the second fan F2 according to the control packet.

Similar to the fan control device 10 of the further another embodiment described above, the master controller MC of the serial fan control system 20 (not depicted) is further configured to generate a notification packet and a control packet according to the further another embodiment of the present disclosure, wherein the notification packet comprises a target ID associated with the target controller. The target controller is at least one of the first fan controller C1 and the second fan controller C2. The control packet comprises another control parameter of a target fan corresponding to the target controller. The first fan controller C1 of the first fan device FC1 further comprises two ports for connecting to the master controller MC and the second fan controller C2 respectively through two specified bus SMB1, SMB2. The first fan controller C1 further sends an acknowledgment packet directly to the master controller MC when receiving the notification packet with the target ID associated with the first fan controller C1. After receiving the control packet, the first fan controller C1 further generates and sends another first driving instruction to the first fan F1 according to the control packet. Similarly, the second fan controller C2 of the second fan device CF2 further sends an acknowledgment directly to the master controller MC when receiving the notification packet with the target ID associated with the second fan controller C2. After receiving the control packet, the second fan controller C2 further generates and sends another second driving instruction to the second fan F2 according to the control packet.

Figure 10:
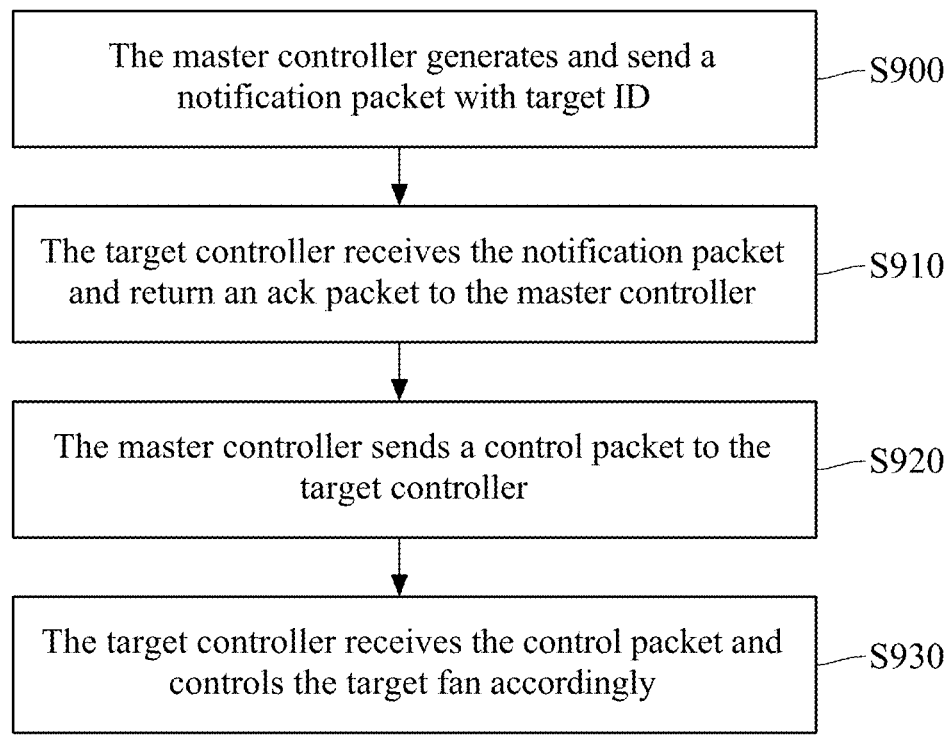
FIG. 10 is a flowchart of the serial fan control method according to further another embodiment of the present disclosure.

Please refer to FIG. 10, which illustrates a flowchart of the serial fan control method according to further another embodiment of the present disclosure. The procedure shown in FIG. 10 can be performed before step S200, generating the serial control data by the master controller MC, be performed after step 224, generating and sending the second driving instruction to the second fan F2 by the second fan controller C2 according to control parameter set of the packet, or be performed after step S240, receiving the serial feedback data by the master controller MC, the present disclosure does not limit the timing to perform the procedure.

Regarding the serial fan control method according to the further another embodiment, please refer to step S900 first. The master controller MC generates and sends a notification packet with the target ID. The target id is associated with a target controller. The target controller is at least one of the first fan controller C1 and the second fan controller C2. Specifically, the master controller MC uses the target ID to select a fan controller, such as the first fan controller C1, the second fan controller C2, or the above two, that will be controlled in this time, Practically, the master controller MC can arbitrary select one or more fan controllers to send the notification packet in a serial structure with a plurality of fan controllers.

Please refer to step S910. The target controller receives the notification packet and returns an acknowledge packet to the master controller. Specifically, the master controller MC sends the notification packet along the paths of serial structure SMB1 and SMB2 described previously, the paths are from the first fan controller C1 to the second fan controller C2. Compared to the previous embodiment, every fan controller receiving the notification packet first checks the target ID thereof. If the target id of the notification packet does not correspond to the fan controller receiving the notification packet currently, it means that this fan controller is not the target controller, and the notification packet will be transmitted to the next level of the serial structure. On the other hand, if the target ID of the notification packet corresponds to the fan controller receiving the notification packet in this time, the fan controller is the target controller. After receiving the notification packet, the target controller directly sends an acknowledgment packet to the master controller MC through the original serial structure SMB1, SMB2. Other fan controllers receiving this acknowledgment packet in the middle of the path may directly pass to the previous level of the serial structure.

Please refer to step S920, the master controller sends a control packet to the target controller. Specifically, the communication between both sides has been established after the master controller MC receives the acknowledgment packet sent from the target controller and then the master controller MC can send the control packet to the target controller. Said control packet comprises another control parameter set of the target fan corresponding to the target controller. Therefore, the target controller can rapidly obtain the aforementioned control parameter set from the master controller MC.

Please refer to step S930, the target controller receives the control packet and controls the target fan accordingly. Specifically, during the transmission of the control packet in the serial structure SMB1, SMB2, each of the fan controllers which is not the target controller will not receive this control packet but passes this control packet to the next level of the serial structure until the target controller receives this control packet. Therefore, the target controller can use said another control parameter set of the control packet to control the target fan corresponding to the target controller.

The embodiment described above is mainly about transmitting the corresponding control packet to one or more specified target fan controllers based on the original serial structure by the master controller. When the serial structure comprises a large number of fan controllers, the embodiment described above can avoid that a large number of control packets of the serial control data causing the transmission delay.

In view of above, the serial transmission fan control device, the serial fan control system and the serial fan control method according to embodiments of the present disclosure use fan controllers or fan devices that are connected to each other to form a serial structure, together with a transmission mechanism of the serial control data consisted of multiple control packets and the serial feedback data consisted of multiple feedback packets, wherein each of packets comprises a control parameter set for controlling a fan, as well as the starting byte and the stopping byte for the controller to extract a packet. Therefore, the present disclosure reduces the area of the wiring of connecting to each fan from the master controller, reduces the difficulty of the layout of the circuit board, decreases the number of control IC, and saves the hardware cost of the fan system in the server.

What is claimed is:

1. A serial transmission fan control device comprising:
    a master controller configured to generate a serial control data, wherein the serial control data comprises a plurality of packets concatenated in an order and each of the plurality of packets comprises a control parameter set of a fan;
    a first fan controller electrically connecting to the master controller, wherein the first fan controller is configured to receive the serial control data, extract a packet from the plurality of packets of the serial control data, control a first fan based on the extracted packet from the serial control data, and send a first downlink serial data, wherein the first downlink serial data comprises all of the plurality of packets of the serial control data except for the extracted packet; and
    a second fan controller electrically connecting the first fan controller, wherein the second fan controller is configured to receive the first downlink serial data and extract a packet from the packets of the first downlink serial data, and control a second fan based on the extracted packet from the first downlink serial data;
    wherein the second fan controller is further configured to generate a second feedback packet;
    wherein the first fan controller is further configured to generate a first feedback packet, receive the second feedback packet and concatenate the first feedback packet and the second feedback packet to form a serial feedback data; and
    wherein the master controller is further configured to receive the serial feedback data from the first fan controller.

2. The serial transmission fan control device of claim 1, wherein the control parameter set comprises a fan address, a fan speed, and a fan activation state.

3. The serial transmission fan control device of claim 2, wherein each of the plurality of packets concatenated in the order comprises a starting byte, a data byte, and a stopping byte, wherein the starting byte or the stopping byte is one of a high level logic, a low level logic, and a tristate state logic.

4. The serial transmission fan control device of claim 1, wherein the packet extracted by the first fan controller is the first packet of the plurality of packets concatenated in the order.

5. The serial transmission fan control device of claim 1, further comprising:
    a third fan controller electrically connecting to the second fan controller,
    wherein the second fan controller further sends a second downlink serial data comprising all of the packets of the first downlink serial data except for the extracted packet, and
    wherein the third fan controller further receives the second downlink serial data and extracts a packet from the packets of the second downlink serial data.

6. The serial transmission fan control device of claim 1, wherein the master controller further generates a notification packet and a control packet, the notification packet has a target ID associated with a target controller, the target controller is at least one of the first fan controller and the second fan controller; and the control packet has another control parameter set;

wherein the first fan controller further comprises two ports for connecting to the master controller and the second fan controller respectively through two specified buses, the first fan controller further sends an acknowledgment packet to the master controller directly when receiving the notification packet with the target ID associated with the first fan controller, and the first fan controller further obtains said another control parameter set when receiving the control packet; and wherein the second fan controller further sends the acknowledgment packet to the master controller directly when receiving the notification packet with the target ID associated with the second fan controller, and the second fan controller further obtains said another control parameter set when receiving the control packet.

7. A serial transmission fan control device comprising:
a master controller configured to generate a serial control data, wherein the serial control data comprises a plurality of packets concatenated in an order and each of the plurality of packets comprises a control parameter set of a fan;
a first fan controller electrically connecting to the master controller, wherein the first fan controller is configured to receive the serial control data, extract a packet from the plurality of packets of the serial control data, control a first fan based on the extracted packet from the serial control data, and send a first downlink serial data, wherein the first downlink serial data comprises all of the plurality of packets of the serial control data except for the extracted packet; and
a second fan controller electrically connecting the first fan controller, wherein the second fan controller is configured to receive the first downlink serial data and extract a packet from the packets of the first downlink serial data, and control a second fan based on the extracted packet from the first downlink serial data;
wherein the first fan controller is further configured to generate a first feedback packet and concatenate the first feedback packet with the first downlink serial data;
wherein the second fan controller is further configured to generate a second feedback packet, concatenate the first feedback packet and the second feedback packet to form a serial feedback data, and the second fan controller further electrically connects to the master controller; and
wherein the master controller is further configured to receive the serial feedback data from the second fan controller.

8. A serial fan control system comprising:
a master controller configured to generate a serial control data, wherein the serial control data comprises a plurality of packets concatenated in an order;
a first fan device comprising a first fan controller and a first fan, wherein the first fan controller electrically connects to the first fan and the master controller, receives the serial control data, extracts a packet from the plurality of packets of the serial control data, sends a first downlink serial data, and generates and sends a first driving instruction to the first fan according to the packet extracted from the plurality of packets of the serial control data, wherein the first downlink serial data comprises all of the plurality of packets of the serial control data except for the extracted packet; and
a second fan device comprising a second fan controller and a second fan, wherein the second fan controller electrically connects to the second fan and the first fan controller, receives the first downlink serial data, extracts a packet from the packets of the first downlink serial data, and generates and sends a second driving instruction to the second fan according to the packet extracted from the packets of the first downlink serial data;
wherein the first fan controller further generates a first feedback packet and concatenates the first feedback packet with the first downlink serial data;
wherein the second fan controller further generates a second feedback packet, concatenates the second feedback packet and the first feedback packet to form a serial feedback data, and electrically connects to the master controller; and
wherein the master controller further receives the serial feedback data from the second fan controller.

9. A serial fan control system comprising:
a master controller configured to generate a serial control data, wherein the serial control data comprises a plurality of packets concatenated in an order;
a first fan device comprising a first fan controller and a first fan, wherein the first fan controller electrically connects to the first fan and the master controller, receives the serial control data, extracts a packet from the plurality of packets of the serial control data, sends a first downlink serial data, and generates and sends a first driving instruction to the first fan according to the packet extracted from the plurality of packets of the serial control data, wherein the first downlink serial data comprises all of the plurality of packets of the serial control data except for the extracted packet; and
a second fan device comprising a second fan controller and a second fan, wherein the second fan controller electrically connects to the second fan and the first fan controller, receives the first downlink serial data, extracts a packet from the packets of the first downlink serial data, and generates and sends a second driving instruction to the second fan according to the packet extracted from the packets of the first downlink serial data;
wherein the second fan controller further generates a second feedback packet;
wherein the first fan controller further generates a first feedback packet, receives the second feedback packet and concatenates the first feedback packet and the second feedback packet to form a serial feedback data; and
wherein the master controller further receives the serial feedback data from the first fan controller.

10. The serial fan control system of claim 9, further comprising:
a third fan device comprising a third fan controller and a third fan, wherein the third fan controller electrically connects to the third fan and the second fan controller,
wherein the second fan controller further sends a second downlink serial data comprising all of the plurality of packets of the first downlink serial data except for the extracted packet; and
wherein the third fan controller further receives the second downlink serial data, extracts a packet from the packets of the second downlink serial data, and generates and sends a third driving instruction to the third fan according to the packet extracted from the packets of the second downlink serial data.

11. The serial fan control system of claim 9, wherein the master controller further generates a notification packet and a control packet, the notification packet has a target ID associated with a target controller, the target controller is at least one of the first fan controller and the second fan controller; and the control packet has another control parameter set of a target fan corresponding the target controller;

wherein the first fan controller of the first fan device further comprises two ports for connecting to the master controller and the second fan controller respectively through two specified buses, the first fan controller further sends an acknowledgment packet to the master controller directly when receiving the notification packet with the target ID associated with the first fan controller, and generates and sends another first driving instruction to the first fan according to the control packet after receiving the control packet; and wherein the second fan controller of the second fan device further sends the acknowledgment packet to the master controller directly when receiving the notification packet with the target ID associated with the second fan controller and generates and sends another second driving instruction to the second fan according to the control packet after receiving the control packet.

12. A serial fan control method comprising:
generating a serial control data by a master controller, wherein the serial control data comprises a plurality of packets concatenated in an order, and each of the plurality of the packets comprises a control parameter set of a fan;
receiving the serial control data and extracting a packet from the plurality of packets of the serial control data by a first fan controller;
after extracting the packet from the plurality of packets of the serial control data, generating and sending a first driving instruction to a first fan according to the control parameter set of the extracted packet by the first fan controller;
after extracting the packet from the plurality of packets of the serial control data, sending a first downlink serial data by the first fan controller, wherein the first downlink serial data comprises all of the plurality of packets of the serial control data except for the extracted packet;
receiving the first downlink serial data by a second fan controller and extracting a packet from the packets of the first downlink serial data; and
after extracting the packet from the packets of the first downlink serial data, generating and sending a second driving instruction to a second fan by the second fan controller according to the control parameter set of the extracted packet from the first downlink serial data;
after extracting the packet of the first downlink serial data, generating and sending a second feedback packet to the first fan controller by the second fan controller;
after extracting the second feedback packet, generating a first feedback packet and concatenating the first feedback packet and the second feedback packet to form a serial feedback data by the first fan controller; and
receiving the serial feedback data from the first fan controller by the master controller.

13. The serial fan control method of claim 12 further comprising: setting a fan address, a fan speed, and a fan activation state to serve as the control parameter set when generating the serial control data by the master controller.

14. The serial fan control method of claim 12 further comprising:
sending a second downlink serial data by the second fan controller after receiving the first downlink serial data, wherein the second downlink serial data comprises packets of the first downlink serial data except for the extracted packet; and
receiving the second downlink serial data and extracting a packet of the second downlink serial data by a third fan controller.

15. The serial fan control method of claim 12, before generating the serial control data by the master controller or after generating and sending the second driving instruction to the second fan according to the control parameter set of the packet by the second fan controller, further comprising:
generating and sending a notification packet by the master controller, wherein the notification packet has a target ID associated with a target controller, and the target controller is at least one of the first fan controller and the second fan controller;
receiving the notification packet and directly returning an acknowledgment packet to the master controller by the target controller;
after receiving the acknowledgment packet, sending a control packet to the target controller by the master controller, wherein the control packet has another control parameter set of a target fan corresponding to the target controller; and
receiving the control packet and controlling the target fan according to said another control parameter set of the control packet by the target controller.

16. A serial fan control method comprising:
generating a serial control data by a master controller, wherein the serial control data comprises a plurality of packets concatenated in an order, and each of the plurality of the packets comprises a control parameter set of a fan;
receiving the serial control data and extracting a packet from the plurality of packets of the serial control data by a first fan controller;
after extracting the packet from the plurality of packets of the serial control data, generating and sending a first driving instruction to a first fan according to the control parameter set of the extracted packet by the first fan controller;
after extracting the packet from the plurality of packets of the serial control data, sending a first downlink serial data by the first fan controller, wherein the first downlink serial data comprises all of the plurality of packets of the serial control data except for the extracted packet;
receiving the first downlink serial data by a second fan controller and extracting a packet from the packets of the first downlink serial data; and
after extracting the packet from the packets of the first downlink serial data, generating and sending a second driving instruction to a second fan by the second fan controller according to the control parameter set of the extracted packet from the first downlink serial data;
before generating the serial control data by the master controller, electrically connecting the master controller, the first fan controller and the second fan controller in a ring;
before sending the first downlink serial data, generating a first feedback packet and concatenating the first feedback packet with the first downlink serial data by the first fan controller;

after receiving the packet of the first downlink serial data by the second fan controller, generating a second feedback packet and concatenating the second feedback packet with the first feedback packet by the second fan controller; and receiving the concatenated first and second feedback packets from the second fan controller by the master controller.

\* \* \* \* \*